(12) United States Patent
Lee (10) Patent No.: US 11,069,924 B2
(45) Date of Patent: Jul. 20, 2021

(54) BATTERY PACK AND OVERDISCHARGE CONTROL METHOD THEREOF

(71) Applicant: Samsung SDI Co., Ltd., Yongin-si (KR)

(72) Inventor: Tae Jin Lee, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 249 days.

(21) Appl. No.: 16/363,559

(22) Filed: Mar. 25, 2019

(65) Prior Publication Data
US 2019/0326648 A1    Oct. 24, 2019

(30) Foreign Application Priority Data

Apr. 24, 2018  (KR) .................. 10-2018-0047452

(51) Int. Cl.
*H01M 10/42* (2006.01)
*H02J 7/00* (2006.01)
(Continued)

(52) U.S. Cl.
CPC .... *H01M 10/425* (2013.01); *G01R 19/16542* (2013.01); *H01M 10/441* (2013.01);
(Continued)

(58) Field of Classification Search
CPC ....... H01M 10/425; H01M 2010/4271; H01M 10/441; H02J 7/0081; H02J 7/0026; H03K 5/24; G01R 19/16542
(Continued)

(56) References Cited

U.S. PATENT DOCUMENTS 7,579,811 B2    8/2009  Sato et al.
8,854,780 B2 *  10/2014 Jung et al. ............... H02H 7/18
                                                 361/79
(Continued)

FOREIGN PATENT DOCUMENTS

EP          1 533 882 A2    5/2005
JP         2000-83325 A     3/2000
(Continued)

OTHER PUBLICATIONS

Extended European Search Report for corresponding European Patent Application No. 19170700.9, dated Sep. 23, 2019, 7 pages.

*Primary Examiner* — Sun J Lin
(74) *Attorney, Agent, or Firm* — Lewis Roca Rothgerber Christie LLP (57) ABSTRACT

A battery pack includes a battery and a battery management system to control and manage charging and discharging of the battery. The battery management system includes an external terminal connected to a charger or an external electronic device, a cell terminal connected to the battery, a charge field effect transistor (FET) and a discharge FET connected between the external terminal and the cell terminal, a voltage sensor to measure a battery voltage of the battery, a comparator comparing the battery voltage with a reference voltage to determine whether the battery pack is in an overdischarged state, and a controller controlling the charge FET to be cut off to prevent a charge operation of the battery, if the comparator determines that the battery pack is in an overdischarged state.

12 Claims, 3 Drawing Sheets

(51) Int. Cl.
    *H03K 5/24*         (2006.01)
    *G01R 19/165*    (2006.01)
    *H01M 10/44*     (2006.01)

(52) U.S. Cl.
    CPC ...... *H02J 7/0026* (2013.01); *H02J 7/007184* (2020.01); *H03K 5/24* (2013.01); *H01M 2010/4271* (2013.01)

(58) Field of Classification Search
    USPC ........................................................ 320/112
    See application file for complete search history.

(56) References Cited

U.S. PATENT DOCUMENTS

| | | |
|---|---|---|
| 2005/0134230 A1 | 6/2005 | Sato et al. |
| 2011/0117396 A1 | 5/2011 | Yang et al. |
| 2012/0166918 A1* | 6/2012 | Svendsli et al. ...... H02J 7/0029 714/807 |
| 2013/0148246 A1 | 6/2013 | Jung et al. |

FOREIGN PATENT DOCUMENTS

| | | |
|---|---|---|
| JP | 4059838 B2 | 3/2008 |
| KR | 10-1050469 B1 | 7/2011 |

* cited by examiner

| Item | | Portable IT | Power-Tool | Medical | E-Bike | E-Scooter | EV/LEV | ESS/UPS |
|---|---|---|---|---|---|---|---|---|
| Standard charging voltage (4.20V cell) | | 4.20V | 4.20V | 4.10V | 4.10V | 4.10V | 4.10V | 4.00V (4.05V) |
| Standard charging voltage (4.35V cell) | | 4.35V | 4.35V | 4.20V | 4.20V | 4.20V | 4.20V | 4.00V (4.05V) |
| Charging method | | CC-CV | CC-CV | CC-CV | CC-CV | CC-CV | CC-CV | CC-CV |
| Full-charging cut-off current* | | 0.05C | 0.05C | 0.025C | 0.025C | 0.025C | 0.025C | 0.025C (Continuous) |
| Voltage of Re-charging (4.20V cell) | | 4.10V | 4.10V | 4.05V | 4.05V | 4.05V | 4.05V | 4.00V (4.05V) |
| Voltage of Re-charging (4.35V cell) | | 4.25V | 4.25V | 4.10V | 4.10V | 4.10V | 4.10V | 4.00V (4.05V) |
| LCO LMO | Min. voltage of terminate discharging | 3.00V | 2.50V | 3.00V | 3.00V | 3.00V | 3.00V | 3.00V |
| | Min. voltage of over-discharging protection | 2.50V | 2.00V | 2.50V | 2.50V | 2.50V | 2.50V | 2.50V |
| NCA NCM | Min. voltage of terminate discharging | 2.50V | 2.50V | 2.50V | 2.50V | 2.50V | 2.50V | 2.50V |
| | Min. voltage of over-discharging protection | 2.30V | 2.00V | 2.50V | 2.50V | 2.50V | 2.50V | 2.50V |
| BMS Shut Down Voltage** (Va) | | 2.00V | 2.00V | 2.00V | 2.00V | 2.00V | 2.00V | 2.00V |
| Max. consumption current of BMS after shut down | | 10μA/Cell | 10μA/Cell | 10μA/Cell | 10μA/Cell | 10μA/Cell | 10μA/Cell | 10μA/Cell |
| Do not charge*** (Vb) | | ↓ 1.00V | ↓ 1.00V | ↓ 1.00V | ↓ 1.00V | ↓ 1.00V | ↓ 1.00V | ↓ 1.00V |
| Pre-charging voltage range**** | | 1.0V ~ 3.0V | 1.0V ~ 3.0V | 1.0V ~ 3.0V | 1.0V ~ 3.0V | 1.0V ~ 3.0V | 1.0V ~ 3.0V | 1.0V ~ 3.0V |
| Current range of Pre-charging | | 0.1C ~ 0.5C | 0.1C ~ 0.5C | 0.1C ~ 0.5C | 0.1C ~ 0.5C | 0.1C ~ 0.5C | 0.1C ~ 0.5C | 0.1C ~ 0.5C |

BATTERY PACK AND OVERDISCHARGE CONTROL METHOD THEREOF

CROSS-REFERENCE TO RELATED APPLICATION

This application claims priority to and the benefit of Korean Patent Application No. 10-2018-0047452 filed on Apr. 24, 2018 in the Korean Intellectual Property Office, the contents of which are incorporated herein by reference in their entirety.

BACKGROUND

1. Field

The present invention relates to a battery pack and an overdischarge control method thereof.

2. Description of the Related Art

In general, an electronic device, such as a notebook, a mini notebook, a net book, a mobile computer, an ultra-mobile personal computer (UMPC), a portable multimedia player (PMP), or the like, uses a battery pack having multiple battery cells connected in series and/or parallel as a portable power source. The battery pack may include a battery management system for protecting battery cells from overcharge, overdischarge or overcurrent, and the battery cells and the battery management system may be incorporated into the battery pack together with a case.

In order to prevent the battery pack from being overdischarged, the battery management system may prevent a discharge operation of the battery pack when the battery pack, a secondary battery, is discharged to have a voltage less than a reference voltage. However, in a case where the battery pack is not used for a long time after preventing the discharge operation of the battery pack, the voltage of the secondary battery may be lowered further due to self-discharge, even after the battery management system is shut down. In this case, copper may precipitate in battery cells of the battery pack due to excessive discharge, and there may be a risk of an internal short circuit.

SUMMARY

Aspects of embodiments of the present invention are directed to a battery management system, a battery pack and an overdischarge control method thereof, which can prevent an overdischarged battery pack from being reused by checking whether the battery pack is in an overdischarged state by comparing a battery voltage with a reference voltage.

According to an embodiment of the present disclosure, there is provided a battery pack including a battery and a battery management system electrically connected to the battery to control and manage charging and discharging of the battery, the battery management system including an external terminal configured to connect to a charger or an external electronic device; a cell terminal connected to the battery; a charge FET connected between the external terminal and the cell terminal; a voltage sensor connected to the cell terminal to measure a voltage of the battery; a comparator to compare the battery voltage with a reference voltage to determine whether the battery pack is in an overdischarged state; and a controller to control the charge FET to prevent charging of the battery if the comparator determines that the battery pack is in the overdischarged state.

The battery pack may further include a discharge FET connected between the external terminal and the cell terminal.

The voltage sensor may be configured to measure the battery voltage at a set time interval and to transmit the measured battery voltage to the comparator in real time.

The comparator may include a first comparator to compare the battery voltage with a first reference voltage for determining whether the battery management system is shut down; and a second comparator to compare the battery voltage with a second reference voltage for determining whether the battery pack is in the overdischarged state, the second reference voltage being smaller than the first reference voltage.

The comparator may further include a counter to count the number of times the battery voltage is greater than the second reference voltage.

The controller may be configured to control the charge FET to be turned on to charge the battery by a voltage applied from the charger if the counter determines that the battery voltage is greater than the second reference voltage twenty times.

The controller may be configured to control the charge FET to be turned off to prevent the voltage applied from the charger from being transmitted to the battery if the comparator determines that the battery voltage is less than or equal to the second reference voltage.

According to another embodiment of the present disclosure, there is provided an overdischarge control method of a battery pack including, when a charger is electrically connected to an external terminal of the battery pack, measuring a battery voltage at a time interval, the battery voltage being a voltage of a battery electrically connected to a cell terminal of the battery pack; comparing the battery voltage with a first reference voltage to determine whether a battery management system of the battery pack is shut down; if the battery voltage is less than or equal to the first reference voltage, comparing the battery voltage with a second reference voltage to determine whether the battery pack is in an overdischarged state; and if the battery voltage is less than or equal to the second reference voltage, controlling a charge FET provided between the cell terminal and the external terminal to prevent charging of the battery.

The method may include, if the battery voltage is greater than the first reference voltage, charging the battery pack by controlling the charge FET to be turned on.

The method may include, if the battery voltage is greater than the second reference voltage, checking whether a number of voltage comparison counts is greater than the second reference voltage, is a reference count number; and if the number of voltage comparison counts is less than the reference count number, incrementing the number of voltage comparison counts by one.

The reference count number may be twenty.

If the number of voltage comparison counts is the reference count number, the checking of the number of voltage comparison counts may include charging the battery pack by controlling the charge FET to be turned on.

The time interval may be 250 ms, the first reference voltage may be 2 V, and the second reference voltage may be 1 V.

According to another embodiment of the present disclosure, there is provided a battery management system, the battery management system being configured to electrically connect to a battery, the battery management system including a charge FET connected between an external terminal of a battery pack and a cell terminal of the battery pack, the external terminal being configured to connect to a charger or an external electronic device, the cell terminal being configured to connect to the battery; a voltage sensor connected to the cell terminal to measure a voltage of the battery; a comparator to compare the battery voltage with a reference voltage to determine whether the battery pack is in an overdischarged state; and a controller to control the charge FET to prevent charging of the battery if the comparator determines that the battery pack is in the overdischarged state.

As described above, in the battery pack, battery management system and the overdischarge control method thereof according to the present disclosure, it is possible to prevent an overdischarged battery pack from being reused by checking whether the battery pack is in an overdischarged state by comparing a battery voltage with a reference voltage.

In addition, in the battery pack, battery management system and the overdischarge control method thereof according to the present disclosure, a battery voltage is compared with a reference voltage, and in a case where the battery management system is shut down, the battery pack is charged only when the battery voltage is maintained to be greater than a second reference voltage for more than a predetermined time, thereby potentially avoiding an accident due to an internal short circuit of an overdischarged battery pack.

DETAILED DESCRIPTION

Hereinafter, example embodiments of the present disclosure will be described in detail. The present invention may be embodied in many different forms and should not be construed as being limited to the example embodiments set forth herein. Rather, these example embodiments are provided so that this disclosure will be thorough and complete and will convey inventive concepts of the disclosure to those skilled in the art.

In addition, in the accompanying drawings, sizes or thicknesses of various components may be exaggerated for brevity and/or clarity. Like numbers refer to like elements throughout. In addition, it will be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise or include" and/or "comprising or including," when used in this specification, specify the presence of stated features, numbers, steps, operations, elements, and/or components, but do not preclude the presence or addition of one or more other features, numbers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the exemplary term "below" can encompass both an orientation of above and below.

Figure 1:
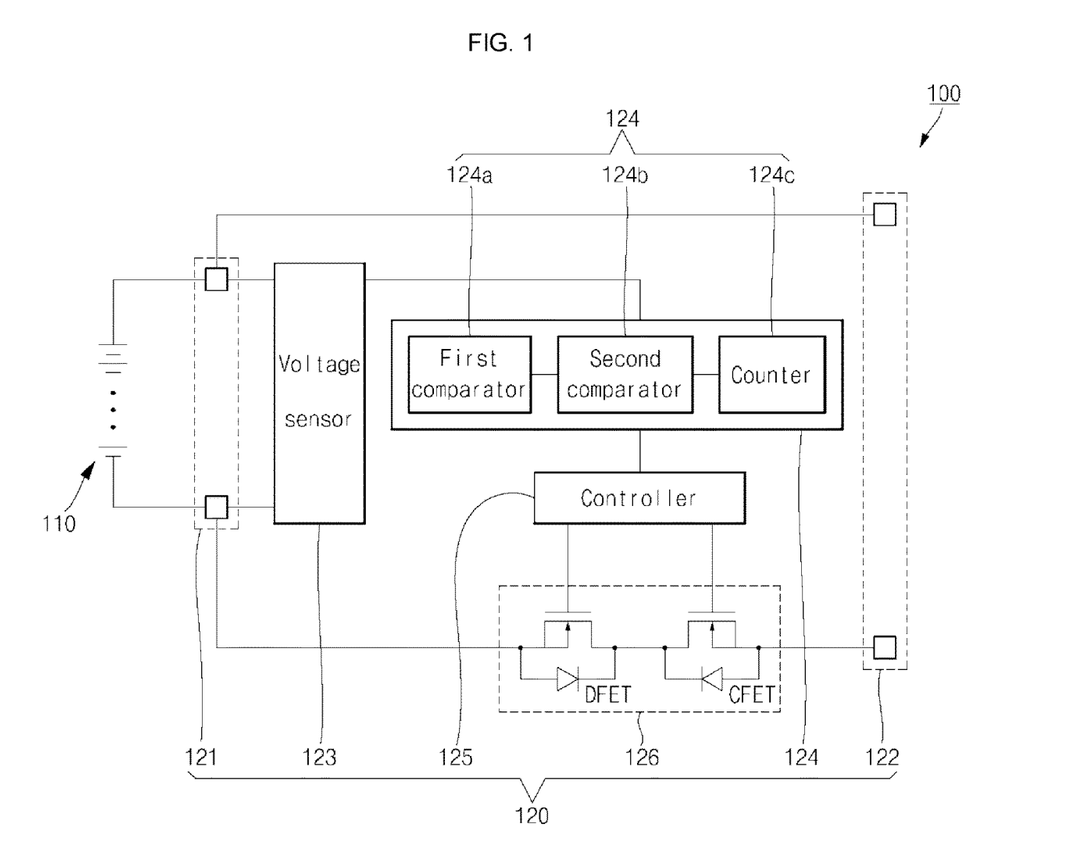
FIG. 1 is a diagram illustrating a configuration of a battery pack according to embodiments of the present disclosure.

Referring to FIG. 1, a diagram illustrating a configuration of a battery pack according to embodiments of the present disclosure is illustrated. In addition, referring to FIG. 2, a flowchart illustrating an overdischarge control method according to embodiments of the present disclosure is illustrated. For example, the overdischarge control method of FIG. 2 may be an overdischarge control method of the battery pack of FIG. 1. Hereinafter, a configuration and operations of the battery pack 100 shown in FIG. 1 will be described with reference to FIGS. 1 and 2.

As illustrated in FIG. 1, the battery pack 100 includes a battery 110 and a battery management system 120. Here, the battery management system 120 of the battery pack 100 may in some embodiments be configured by arranging various electronic devices on one or more printed circuit board (PCB), e.g., by spot welding or soldering, to control (e.g., stably control) charging and discharging of the battery 110. The battery 110 may include one or more rechargeable battery cells connected in series and/or in parallel. The battery cells of the battery 110 may be prismatic, cylindrical or pouch-type battery cells.

The battery management system 120 may include a cell terminal 121, an external terminal 122, a voltage sensor 123, a comparator 124, a controller 125 and charge/discharge FETs 126.

The cell terminal 121 includes two terminals to be electrically connected to a positive electrode and a negative electrode of the battery 110.

The external terminal 122 may include two terminals, which may be connected to a charger or an external electronic device. Once connected to the charger, the external terminal 122 is capable of charging the battery 110 electrically connected to the cell terminal 121 by current applied through the charger. In addition, once connected to the external electronic device, the external terminal 122 is capable of driving the external electronic device by a voltage output by discharging of the battery 110. The external terminal 122 may be connected to the cell terminal 121 in parallel (e.g., a first terminal of the external terminal 122 may be connected to a first terminal of the cell terminal 121, and a second terminal of the external terminal 122 may be connected to a second terminal of the cell terminal 121).

Figure 2:
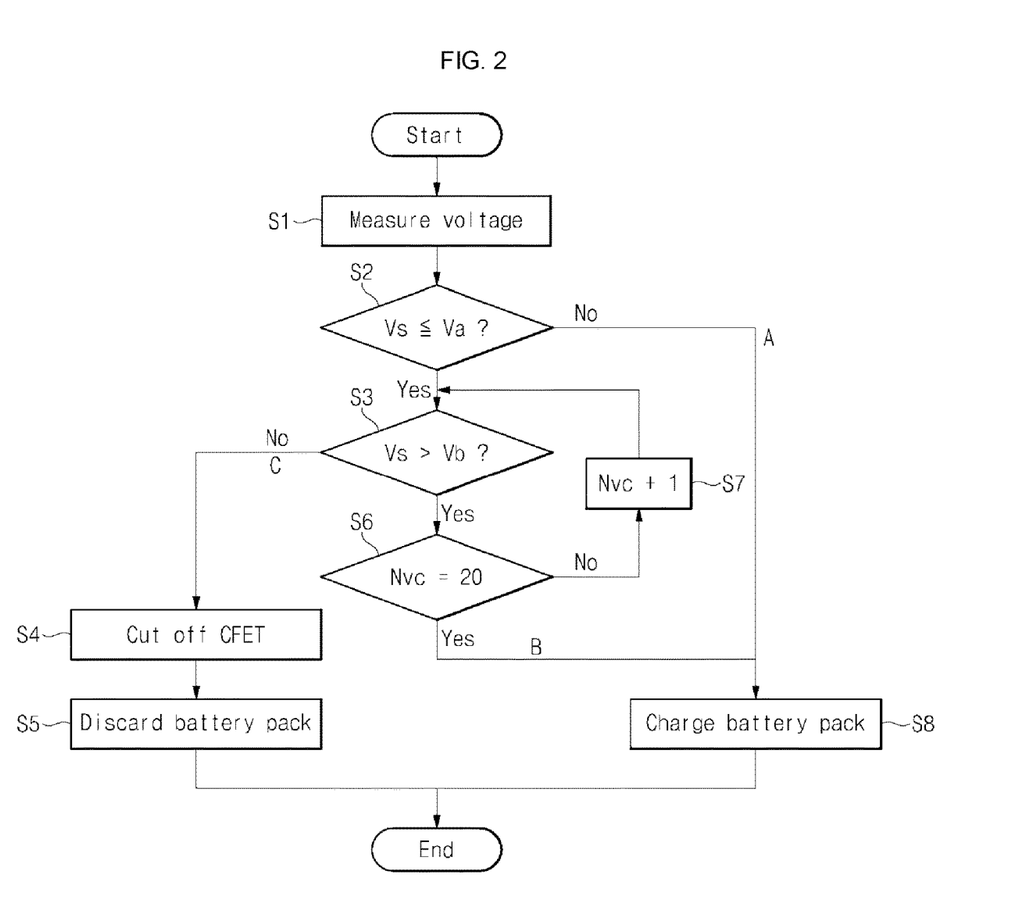
FIG. 2 is a flowchart illustrating an overdischarge control method according to embodiments of the present disclosure.

If the charger is electrically connected to the external terminal 122, the voltage sensor 123 may measure a voltage Vs of the battery 110 before the voltage applied from the charger is transmitted to the battery 110. The battery voltage Vs is measured to determine whether or not the battery 110 is in an overdischarged state in which the battery cannot be reused. In order to measure the battery voltage Vs, the voltage sensor 123 may be electrically connected to the cell terminal 121. The voltage sensor 123 may measure the voltage Vs of the battery 110 by measuring the voltage between the terminals of the cell terminal 121 electrically connected to the battery 110 (act S1). The voltage sensor 123 may measure the battery voltage Vs at a regular time interval. For example, the voltage sensor 123 may measure the battery voltage Vs at a time interval of 250 ms, but aspects of the present disclosure are not limited thereto, and other suitable time intervals apparent to those skilled in the art are considered to be within the scope of the present disclosure. For the sake of convenient explanation, the battery management system 120 will now be described with regard to the voltage sensor 123 measuring the battery voltage Vs at an exemplary time interval of 250 ms. In addition, the battery pack 100 may transmit the battery voltage Vs periodically measured by the voltage sensor 123 at a regular time interval to the comparator 124 in real time.

The comparator 124 may include a first comparator 124a, a second comparator 124b and a counter 124c. The first comparator 124a may be electrically connected to the second comparator 124b.

The battery voltage Vs transmitted from the voltage sensor 123 may be transmitted to the first comparator 124a. After receiving the battery voltage Vs from the voltage sensor 123, the first comparator 124a may compare the received battery voltage Vs with a first reference voltage Va to determine whether the battery voltage Vs is less than or equal to the first reference voltage Va (that is, if Vs≤Va) (act S2). Here, the first reference voltage Va may be a battery management system (BMS) shut down voltage for determining whether the battery management system 120 is shut down. The first comparator 124a may determine that the battery management system 120 is in a shut-down state before the charge FET (CFET) is connected to the external terminal 122 if the battery voltage Vs measured by the voltage sensor 123 is less than or equal to the first reference voltage Va.

In addition, the first comparator 124a may determine that the battery management system 120 is not in a shut-down state if the battery voltage Vs measured by the voltage sensor 123 is greater than the first reference voltage Va. Here, if the battery voltage Vs is greater than the first reference voltage Va, the first comparator 124a may transmit a first voltage comparison result A to the controller 125 (that is, the procedure flows along a "NO" path in act S2). Here, the first voltage comparison result A means that the battery voltage Vs is greater than the first reference voltage Va for determining whether the battery management system 120 is shut down.

Figure 3:
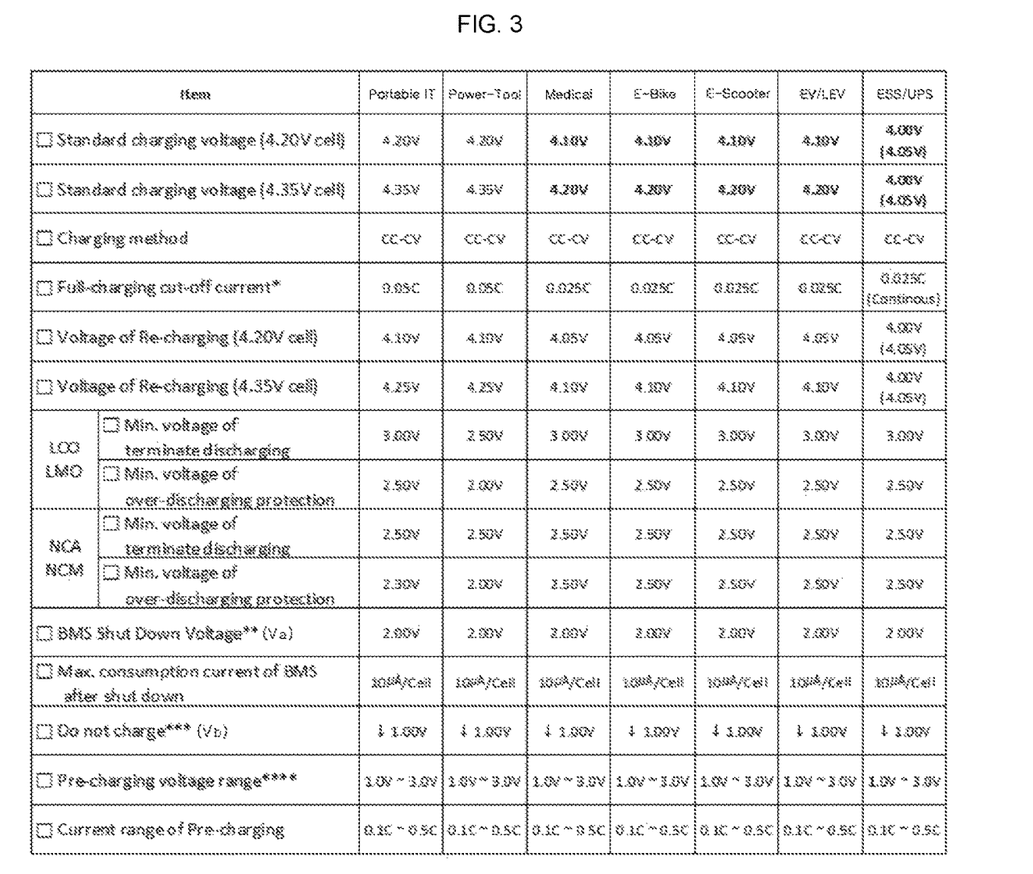
FIG. 3 illustrates exemplary characteristics of battery packs according to embodiments of the present disclosure.

FIG. 3 illustrates exemplary characteristics (e.g., guidelines) of seven battery packs according to embodiments of the present disclosure, but the present disclosure is not limited to those seven types of battery packs. FIG. 3 shows that a plurality of battery cells included in the battery pack 100 can have standard charging voltages of 4.2 V and 4.35 V, which are, however, different according to capacities and voltages of the battery cells of the battery pack 100. In addition, FIG. 3 discloses the first reference voltage Va for each of various battery packs to determine whether the battery management system 120 is shut down. Here, the first reference voltage Va of each of the battery packs is set to 2 V, but the present invention does not limit the first reference voltage Va to 2 V. The first reference voltage Va may differ according to the capacity of each of battery cells of the battery pack 100. In some embodiments, the first reference voltage Va may be 2 V only when the standard charging voltages are 4.2 V and 4.35 V.

If the first voltage comparison result A is applied to the controller 125, the controller 125 controls the charge/discharge FETs 126 to be driven to charge the battery pack 100 by the voltage applied from the charger (act S8). Here, the controller 125 controls the charge FET CFET to be turned on, thereby transmitting the voltage applied from the charger to the battery 110. That is to say, if the battery voltage Vs is greater than the first reference voltage Va, the battery pack 100 may be charged by the voltage applied from the charger.

If the battery voltage Vs received from the voltage sensor 123 is less than or equal to the first reference voltage Va, the first comparator 124a may determine that the battery management system 120 is and/or has been in a shut-down state. If it is determined that the battery management system 120 is and/or has been in a shut-down state, the first comparator 124a may transmit the battery voltage Vs received from the voltage sensor 123 to the second comparator 124b. Alternatively, in some embodiments, the second comparator 124b may receive the battery voltage VS from the voltage sensor 123.

After receiving the battery voltage Vs from the first comparator 124a (or from the voltage sensor 123), the second comparator 124b may compare the received battery voltage Vs with a second reference voltage Vb to determine whether the battery voltage Vs is greater than the second reference voltage Vb (that is, if Vs>Vb) (act S3). Here, the second reference voltage Vb may be a voltage for determining whether the battery pack 100 is in an overdischarged state in which the battery pack 100 cannot be reused.

FIG. 3 discloses the second reference voltage Vb to determine whether the battery pack 100 is reusable (or, e.g., whether it is in an overdischarged state) for each of various exemplary battery packs. The second reference voltage Vb of each of the battery packs is set to 1 V, but the present invention does not limit the second reference voltage Vb to 1 V. The second reference voltage Vb may differ according to the capacity of each of battery cells of the battery pack 100. In some embodiments, the second reference voltage Vb may be 1 V only when the standard charging voltages are 4.2 V and 4.35 V.

The second comparator 124b may be connected (e.g., electrically connected) to the counter 124c. When the second comparator 124b determines that the battery voltage Vs is greater than the second reference voltage Vb, the counter 124c checks whether the number of voltage comparison counts (Nvc) is greater than a reference count number. The reference count number may be a set (e.g., predetermined) number. For example, in some embodiments, the reference count number may be twenty. Hereinafter, the reference count number will be described as being twenty, but those of skill in the art will understand that other embodiments could utilize other values without departing from the spirit and scope of the present disclosure, and the present disclosure is therefore not limited to embodiments where the reference count number is twenty. In an embodiment in which the reference count number is twenty, when the second comparator 124b determines that the battery voltage Vs is greater than the second reference voltage Vb, the counter 124c checks whether the number of voltage comparison counts (Nvc) is twenty (that is, if Nvc=20) (act S6). That is to say, if the comparison results of the second comparator 124b indicate that the battery voltage Vs is maintained to be greater than the second reference voltage Vb greater than twenty times, the counter 124c may transmit a second voltage comparison result B to the controller 125. In an embodiment where the voltage sensor 123 measures the voltage of the battery 110 with an interval of 250 ms, if the battery voltage Vs is maintained to be greater than the second reference voltage Vb for 5 seconds, resulting in the Nvc counted by the second comparator 124b is twenty, the counter 124c may transmit the second voltage comparison result B to the controller 125 (that is, the procedure flows along a "YES" path in act S6). Here, the second voltage comparison result B means that the battery voltage Vs is maintained for a reference time to be greater than the second reference voltage Vb for checking whether the battery pack 100 is reusable. The reference time may be a time taken for the voltage sensor 123 to measure the voltage of the battery 110 twenty times. When the voltage sensor 123 measures a voltage once each 250 ms, the reference time may be 5 seconds.

If the second voltage comparison result B is applied to the controller 125, the controller 125 may control the charge/discharge FETs 126 to be driven to charge the battery pack 100 by the voltage applied from the charger (act S8). The controller 125 may control the charge FET CFET to be turned on, thereby transmitting the voltage applied from the charger to the battery 110. That is to say, the battery pack 100 may charge the battery 110 utilizing the voltage applied from the charger. If the charger is connected to the external terminal 122 in a state in which the battery management system 120 is shut down, the battery management system 120 may only allow the battery 110 to be charged when the battery voltage Vs is greater than the second reference voltage Vb for a set (e.g., predetermined) time or when the battery voltage Vs is greater than the second reference voltage Vb greater than a set (e.g., predetermined) number of times, thereby potentially improving the safety of the battery pack 100.

Where the Nvc counted by the counter 124c is less than twenty, if the battery voltage Vs is greater than the second reference voltage Vb, as compared by the second comparator 124b, the counter 124c may increment the Nvc (e.g., by one) (that is, Nvc+1) (act S7), and may cumulatively store the Nvc. That is to say, if the battery voltage Vs is greater than the second reference voltage Vb, as compared by the second comparator 124b, the counter 124c may count up the Nvc once more. When the charger is disconnected (e.g., electrically disconnected) from the external terminal 122, the counter 124c may reset a value of the Nvc (e.g., may set Nvc to zero).

If the battery voltage Vs is less than or equal to the second reference voltage Vb, the second comparator 124b determines that the battery pack 100 is in an overdischarged state, thereby transmitting a signal for preventing the battery pack 100 from being charged to the controller 125. That is to say, if the battery voltage Vs is less than or equal to the second reference voltage Vb, the second comparator 124b may transmit a third voltage comparison result C to the controller 125 (that is, the procedure flows along a "NO" path in act S3). Here, the third voltage comparison result C may mean that the battery voltage Vs is less than or equal to the second reference voltage Vb for checking whether the battery pack 100 is reusable, suggesting that the battery pack 100 is not reusable. If the battery voltage Vs is less than or equal to the second reference voltage Vb (or, in some embodiments, a voltage lower than the second reference voltage Vb), an internal short circuit may occur in the battery 110 due to precipitation of copper, which is caused when the battery pack 100 is overdischarged, thereby preventing the battery pack 100 from being reused or rendering the battery pack 100 unsafe or less safe to use. In some embodiments, the third voltage comparison result C may be the absence of transmitting the first voltage comparison result A to the controller. In some embodiments, the first voltage comparison result A and the third voltage comparison result C may be different levels of a signal (e.g., the first voltage comparison result A is a high level, and the third voltage comparison result C is a low level).

If the third voltage comparison result C is applied to the controller 125, the controller 125 may control the charge/discharge FETs 126 to be cut off (or may control the charge/discharge FETs 126 to remain in a disconnected state) to prevent the voltage applied from the charger from being transmitted to the battery 110 (act S4). The controller 125 maintains the control FET CFET to be in the cut-off state, thereby preventing the voltage applied from the charger from being transmitted to the battery 110. That is to say, if the battery voltage Vs is less than or equal to the second reference voltage Vb for checking whether or not the battery pack 100 is in an overdischarged state, the controller 125 may prevent the battery pack 100 from being charged. As described above, the battery pack 100, which is discharged to have a voltage less than or equal to the second reference voltage Vb thereby potentially becoming vulnerable to a short circuit due to precipitation of copper, may be discarded to prevent the battery pack 100 from being charged by the charger and/or being reusable (act S5). Additionally, in some embodiments, in a state in which the charger is connected to the external terminal 122, if the battery pack 100 is not charged even after the reference time taken for the voltage sensor 123 to measure voltages twenty times, it may be determined not to be reusable and may be discarded.

The controller 125, which is electrically connected to the comparator 124, may control the charge/discharge FETs 126 to be driven according to the first voltage comparison result A, the second voltage comparison result B or the third voltage comparison result C applied from the comparator 124 in real time.

If the first voltage comparison result A or the second voltage comparison result B is applied from the comparator 124 to the controller 125, the controller 125 may control the charge FET CFET to be turned on, thereby charging the battery 110 utilizing the voltage applied through the external terminal 122. If the third voltage comparison result C is applied from the comparator 124 to the controller 125, the controller 125 may control the charge FET CFET to be turned off to prevent the voltage applied through the external terminal 122 from being transmitted to the battery 110, thereby preventing the battery pack 100 from being reused (e.g., recharged).

The charge/discharge FETs 126 may include the charge FET (CFET) and the discharge FET (DFET) connected in a high current path provided between the cell terminal 121 and the external terminal 122 and having control electrodes electrically connected to the controller 125 to be driven under the control of the controller 125.

The DFET of the charge/discharge FETs 126 may be turned on during discharging and the CFET may be turned on during charging, so that the battery 110 electrically connected to the cell terminal 121 may be discharged or charged through the charger or the external electronic device electrically connected to the external terminal 122.

Where the controller 125 determines that the battery 110 is overdischarged, the CFET of the charge/discharge FETs 126 may be controlled to be cut off (e.g., turned off, or put into a state where the charge/discharge FETs do not conduct current). Here, the DFET may also be cut off. The charge/discharge FETs 126 may consist of field effect transistors (FETs), which are N-type FETs or P-type FETs.

The electronic or electric devices and/or any other relevant devices or components according to embodiments of the present disclosure described herein (including, for example, the controller 125, the voltage sensor 123, and/or the comparator 124) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

In the battery pack 100 according to the present disclosure, the battery voltage Vs is measured to be compared with the first reference voltage Va and/or the second reference voltage Vb to check whether the battery pack 100 is in an overdischarged state, and a battery pack 100 which is in the overdischarged state may be prevented from being reused (e.g., prevented from being recharged). In addition, in the battery pack 100 according to the present disclosure, the battery voltage Vs is compared with the first reference voltage Va, which is a voltage for determining whether the battery management system 120 is shut down, and/or the second reference voltage Vb and the battery pack 100 is charged only when the battery voltage Vs is maintained to be greater than the second reference voltage Vb for more than a set (e.g., predetermined) time, thereby potentially avoiding an accident due to an internal short circuit of the battery pack 100.

While the battery management system, the battery pack and the overdischarge control method thereof according to the present disclosure have been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. A battery pack comprising a battery and a battery management system electrically connected to the battery to control and manage charging and discharging of the battery, the battery management system comprising:
   an external terminal configured to connect to a charger or an external electronic device;
   a cell terminal connected to the battery;
   a charge field effect transistor (FET) and a discharge FET connected in series between the external terminal and the cell terminal;
   a voltage sensor connected to the cell terminal to measure a battery voltage of the battery;
   a comparator to determine whether the battery management system is shut down, and in response to determining that the battery management system is shut down, to compare the battery voltage with a reference voltage to determine whether the battery pack is in an overdischarged state; and
   a controller to control the charge FET to prevent charging of the battery if the comparator determines that the battery pack is in the overdischarged state.

2. The battery pack of claim 1, wherein the comparator comprises:
   a first comparator to compare the battery voltage with a first reference voltage for determining whether the battery management system is shut down; and
   a second comparator to compare the battery voltage with a second reference voltage for determining whether the battery pack is in the overdischarged state, the second reference voltage being smaller than the first reference voltage.

3. A battery pack comprising a battery and a battery management system electrically connected to the battery to control and manage charging and discharging of the battery, the battery management system comprising:
   an external terminal configured to connect to a charger or an external electronic device;
   a cell terminal connected to the battery;

a charge field effect transistor (FET) and a discharge FET connected in series between the external terminal and the cell terminal;

a voltage sensor connected to the cell terminal to measure a battery voltage of the battery;

a comparator to compare the battery voltage with a reference voltage to determine whether the battery pack is in an overdischarged state; and a controller to control the charge FET to prevent charging of the battery if the comparator determines that the battery pack is in the overdischarged state, wherein the voltage sensor is configured to measure the battery voltage at a set time interval and to transmit the measured battery voltage to the comparator in real time.

4. The battery pack of claim 3, wherein the comparator comprises:

a first comparator to compare the battery voltage with a first reference voltage for determining whether the battery management system is shut down; and a second comparator to compare the battery voltage with a second reference voltage for determining whether the battery pack is in the overdischarged state, the second reference voltage being smaller than the first reference voltage.

5. The battery pack of claim 4, wherein the comparator further comprises a counter to count a number of times the battery voltage is greater than the second reference voltage.

6. The battery pack of claim 5, wherein the controller is configured to control the charge FET to be turned on to charge the battery by a voltage applied from the charger if the counter determines that the battery voltage is greater than the second reference voltage twenty times.

7. The battery pack of claim 5, wherein the controller is configured to control the charge FET to be turned off to prevent a voltage applied from the charger from being transmitted to the battery if the comparator determines that the battery voltage is less than or equal to the second reference voltage.

8. An overdischarge control method of a battery pack comprising:

when a charger is electrically connected to an external terminal of the battery pack, measuring a battery voltage at a time interval, the battery voltage being a voltage of a battery electrically connected to a cell terminal of the battery pack;

comparing the battery voltage with a first reference voltage to determine whether a battery management system of the battery pack is shut down;

if the battery voltage is less than or equal to the first reference voltage, comparing the battery voltage with a second reference voltage to determine whether the battery pack is in an overdischarged state; and if the battery voltage is less than or equal to the second reference voltage, controlling a charge field effect transistor (FET) provided between the cell terminal and the external terminal to prevent charging of the battery.

9. The overdischarge control method of claim 8, further comprising, if the battery voltage is greater than the first reference voltage, charging the battery pack by controlling the charge FET to be turned on.

10. The overdischarge control method of claim 8, further comprising, if the battery voltage is greater than the second reference voltage, checking whether a number of voltage comparison counts is greater than the second reference voltage, which is a reference count number; and if the number of voltage comparison counts is less than the reference count number, incrementing the number of voltage comparison counts by one.

11. The overdischarge control method of claim 10, wherein if the number of voltage comparison counts is the reference count number, the checking of the number of voltage comparison counts comprises charging the battery pack by controlling the charge FET to be turned on.

12. The overdischarge control method of claim 8, wherein the time interval is 250 ms, the first reference voltage is 2 V, and the second reference voltage is 1 V.

* * * * *